United States Patent
Maynollo et al.

(10) Patent No.: US 8,039,931 B2
(45) Date of Patent: Oct. 18, 2011

(54) POWER SEMICONDUCTOR COMPONENT HAVING A TOPMOST METALLIZATION LAYER

(75) Inventors: Josef Maynollo, Wappinger Falls, NY (US); Thomas Detzel, Villach (AT)

(73) Assignee: Infineon Technologies AG, Neubiberg (DE)

( * ) Notice: Subject to any disclaimer, the term of this patent is extended or adjusted under 35 U.S.C. 154(b) by 808 days.

(21) Appl. No.: 11/287,736

(22) Filed: Nov. 28, 2005

(65) Prior Publication Data

US 2006/0145342 A1 Jul. 6, 2006

(30) Foreign Application Priority Data

Nov. 29, 2004 (DE) .......... 10 2004 057 485

(51) Int. Cl.
*H01L 21/00* (2006.01)
*H01L 29/66* (2006.01)
*H01L 23/495* (2006.01)
(52) U.S. Cl. ......... 257/666; 257/341; 257/672; 438/123
(58) Field of Classification Search ........... 438/123; 257/341, 666, 672
See application file for complete search history.

(56) References Cited

U.S. PATENT DOCUMENTS

| | | | | |
|---|---|---|---|---|
| 5,619,065 A * | 4/1997 | Kim | | 257/673 |
| 5,665,991 A | 9/1997 | Efland et al. | | |
| 5,677,566 A * | 10/1997 | King et al. | | 257/666 |
| 5,684,330 A * | 11/1997 | Lee | | 257/692 |
| 5,814,894 A * | 9/1998 | Igarashi et al. | | 257/787 |
| 5,821,609 A * | 10/1998 | DiStefano et al. | | 257/669 |
| 6,268,652 B1 * | 7/2001 | Kimura | | 257/696 |
| 6,392,293 B2 * | 5/2002 | Sugihara et al. | | 257/690 |
| 6,552,427 B2 * | 4/2003 | Moden | | 257/692 |
| 6,700,210 B1 * | 3/2004 | Smith | | 257/790 |
| 6,706,971 B2 * | 3/2004 | Albert et al. | | 174/255 |
| 6,743,696 B2 * | 6/2004 | Jeung et al. | | 438/458 |
| 6,779,258 B2 * | 8/2004 | Prindiville et al. | | 29/832 |
| 6,841,418 B2 * | 1/2005 | Jeung et al. | | 438/108 |
| 6,844,615 B1 * | 1/2005 | Edwards et al. | | 257/666 |
| 7,038,315 B2 * | 5/2006 | King et al. | | 257/738 |
| 2002/0140062 A1 * | 10/2002 | Oida et al. | | 257/668 |
| 2004/0007778 A1 * | 1/2004 | Shinozaki et al. | | 257/759 |
| 2004/0136123 A1 * | 7/2004 | Nakamura et al. | | 361/35 |
| 2004/0178512 A1 * | 9/2004 | Moden et al. | | 257/784 |
| 2004/0188810 A1 * | 9/2004 | Tellkamp | | 257/666 |
| 2004/0212053 A1 * | 10/2004 | Koh et al. | | 257/676 |
| 2004/0217474 A1 * | 11/2004 | Kajiwara et al. | | 257/734 |
| 2004/0227258 A1 * | 11/2004 | Nakatani | | 257/787 |
| 2005/0046001 A1 * | 3/2005 | Warner | | 257/678 |
| 2005/0087859 A1 * | 4/2005 | Chao et al. | | 257/700 |

* cited by examiner

*Primary Examiner* — James M Mitchell
(74) *Attorney, Agent, or Firm* — Dicke, Billig & Czaja, PLLC

(57) ABSTRACT

A power semiconductor component and a method for the production of a power semiconductor component are disclosed. According to one embodiment of the invention, a topmost metallization region that is provided is formed in a manner extended laterally and outside contacts formed, in such a way that, as a result, a protection and sealing material region to be provided is formed, whilst avoiding electrically insulating additional protection and sealing layers that are usually to be provided.

8 Claims, 4 Drawing Sheets

POWER SEMICONDUCTOR COMPONENT HAVING A TOPMOST METALLIZATION LAYER

CROSS-REFERENCE TO RELATED APPLICATIONS

This Utility Patent Application claims priority to German Patent Application No. DE 10 2004 057 485.5, filed on Nov. 29, 2004, which is incorporated herein by reference.

FIELD OF THE INVENTION

The present invention relates to a power semiconductor component and to a method for the production of a power semiconductor component. The present invention relates in particular to a novel design for a metallization and passivation for integrated power circuits.

BACKGROUND

In the production of integrated power circuits and of power semiconductor components, it is important, during the end processes of the overall production method, to protect the semiconductor circuit arrangement that has already been formed and on which the power semiconductor component is based in the underlying semiconductor material region with respect to specific end processes and the mechanical, thermal and contamination loading associated therewith. Usually, for this purpose, after the formation of the underlying semiconductor circuit arrangement, a protection and sealing material is applied on the corresponding topmost metallization or top metallization, which material has an electrically insulating effect and protects the underlying structures against mechanical, thermal and contamination stresses.

What is problematic about this procedure is that the material layer stacks used in this case have to be provided as additional measures. On account of the higher complexity of the structures, this leads to reliability losses and to an additional process engineering outlay in the overall production method. Furthermore, the materials used in this case are associated with a cost factor which must not be underestimated.

SUMMARY

The present invention provides a power semiconductor component. In one embodiment, the power semiconductor component includes a semiconductor structure with a surface region. At least one semiconductor circuit region is provided in the semiconductor structure. One or more contacts are provided associated with the topmost metallization region for the contact-connection of the semiconductor circuit region, in the surface region of the semiconductor structure and electrically connected thereto via contact locations therein. A metallization region is provided, configured to extend laterally outside with respect to the contact locations and the contacts.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

Figure 1:
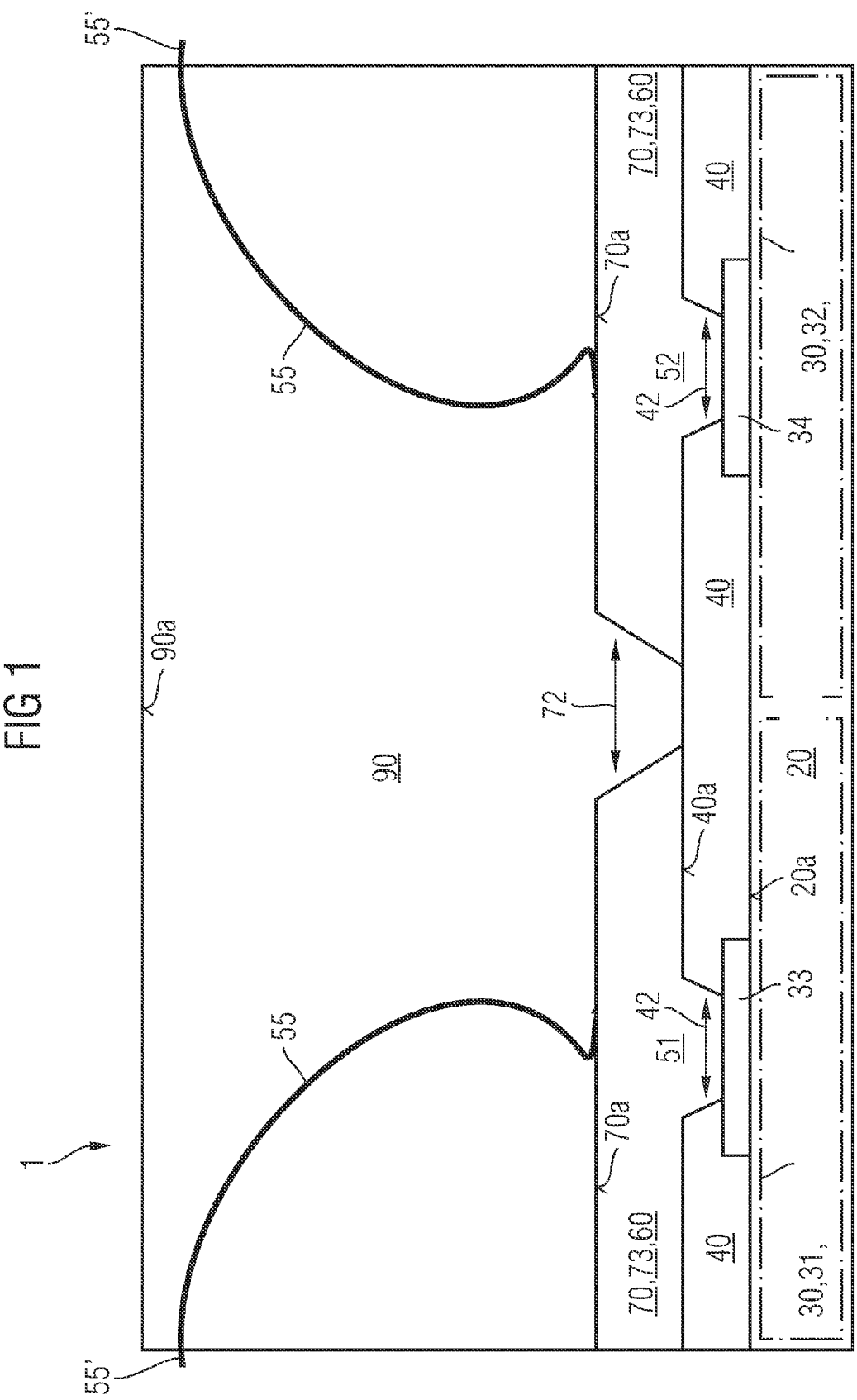
FIG. 1 is a schematic and sectional side view of a first embodiment of the power semiconductor component according to the invention.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

The present invention provides a power semiconductor component and also a corresponding production method in the case of which, with a particularly low outlay, provides power semiconductor components having improved reliability.

According to one embodiment of the invention, in the case of the integrated power semiconductor component proposed, provision is made of a semiconductor material region or a basic semiconductor structure with a surface region. At least one semiconductor circuit region is provided in the semiconductor material region or in the basic semiconductor structure. For the contact-connection of the semiconductor circuit region, in the surface region of the semiconductor material region or of the basic semiconductor structure and electrically connected thereto via contact locations therein, contacts are provided with or from a topmost metallization region. Provision is made of an embedding material region for embedding the semiconductor material region or the basic semiconductor structure with the contact locations and the contacts. According to one embodiment of the invention, below the embedding material region, a protection and sealing material region is provided laterally outside with respect to the contact locations and the contacts. According to one embodiment of the invention, the topmost metallization region is formed in a manner extended laterally also outside with respect to the contact locations and the contacts in such a way that, as a result, the topmost metallization region laterally almost completely covers the directly underlying structures of the integrated power semiconductor component, and that, as a result, the protection and sealing material region is formed directly by the topmost metallization region whilst avoiding customary and additional electrically insulating protection and sealing stack layers.

In one embodiment, a central idea of the present invention, in the case of a power semiconductor component, is the provision of a topmost metallization region which is formed in extended fashion and extends laterally beyond the contacts for the contact-connection of the contact locations of the underlying semiconductor circuit arrangement and of the underlying semiconductor circuit region, so that, as a result, the protection and sealing material region and the functionality thereof are concomitantly formed inherently. This avoids the need to provide customary and additional electrically insulating protection and sealing stack layers, thus resulting in simpler and more cost-effective material structures with correspondingly simplified production methods by comparison with the prior art.

In the sense of the invention, the structure presented may in each case be based on a semiconductor material region or on a basic semiconductor structure. This may be understood, e.g., in each case to mean a semiconductor substrate in or on which basic structures, e.g., for source, drain, gate, contact-connections and/or the like, are in each case introduced or applied, so that the topmost metallization region is, e.g., a second metallization or metallization layer. In particular, the basic semiconductor structure may be understood to mean a structure which is constructed in more complex fashion and, by way of example, already has a plurality of n metallizations, so that the topmost metallization region is e.g., an (n+1)-th metallization or metallization layer.

In one embodiment of the power semiconductor component according to the invention, the topmost metallization region overall and, consequently, the contacts and the protection and sealing material region are formed integrally with one another as a continuous material region.

As an alternative or in addition, in another preferred embodiment of the power semiconductor component according to the invention, for the electrical insulation of regions or contacts that are to be electrically insulated from one another, electrically insulating trench structures are formed which extend from the surface region of the topmost metallization region continuously as far as the surface region of a material region respectively lying directly below the topmost metallization region.

In another alternative or additional embodiment of the power semiconductor component according to the invention, the trench structure is in each case filled with an electrically insulating material.

As an alternative or in addition thereto, the trench structure may be in each case filled with the material of the embedding material region.

In another advantageous embodiment of the power semiconductor component according to the invention, for the external electrical contact-connection of semiconductor circuit regions of the underlying semiconductor circuit arrangement, provision is made of contact elements or bonding wires which are electrically contact-connected to the contacts, which are partly embedded in the embedding material region and which form or have an electrical connection outwardly outside the embedding material region.

In another advantageous embodiment of the power semiconductor component according to the invention, in order to improve the adhesion with the embedding material region, the surface region of the topmost metallization region is additionally or alternatively subjected to surface treatment.

In addition or as an alternative, in another advantageous embodiment of the power semiconductor component according to the invention, in order to improve the adhesion with the embedding material region, the surface region of the contact elements or bonding wires may be subjected to surface treatment.

The topmost metallization region may be formed e.g., by sputtering, vapour deposition, electroplating, autogenous electroplating or CVD.

Metals, semimetals, metal alloys, electrically conductive materials generally or compounds or mixtures thereof, e.g., aluminium, copper, aluminium-copper or AlCu, AlCuSi, AlSiCu, tungsten, nickel, nickel-phosphorous or NiP, palladium, gold, molybdenum, silver, zinc, doped polysilicon or mixtures or compounds thereof, are taken into consideration as metallization material for the topmost metallization region.

A further embodiment of the present invention proposes a method for the production of an integrated power semiconductor component.

Provision is made of a semiconductor material region or a basic semiconductor structure with a surface region.

At least one semiconductor circuit region is provided in the semiconductor material region or in the basic semiconductor structure.

For the contact-connection of the semiconductor circuit region, in the surface region of the semiconductor material region or of the basic semiconductor structure and electrically connected thereto via contact locations therein, contacts are provided with or from a topmost metallization region, Provision is made of an embedding material region for embedding the semiconductor material region or the basic semiconductor structure with the contact locations and the contacts.

Below the embedding material region, a protection and sealing material region is provided laterally outside with respect to the contact locations and the contacts.

The topmost metallization region being formed in a manner extended laterally also outside with respect to the contact locations and the contacts in such a way that, as a result, the topmost metallization region laterally almost completely covers the directly underlying structures of the integrated power semiconductor component. As a result, the protection and sealing material region is formed directly by the topmost metallization region whilst avoiding customary and additional electrically insulating protection and sealing stack layers.

In one manner, the topmost metallization region overall and, consequently, the contacts and the protection and sealing material region may be formed integrally with one another as a continuous material region.

As an alternative or in addition, in one preferred embodiment of the method according to the invention, it is provided that for the electrical insulation of regions or contacts that are to be electrically insulated from one another, electrically insulating trench structures are formed which extend from the surface region of the topmost metallization region continuously as far as the surface region of a material region respectively lying directly below the topmost metallization region.

In another embodiment of the method according to the invention, it is provided as an alternative or in addition that the trench structure is in each case filled with an electrically insulating material.

In this case, the trench structure may be in each case filled with the material of the embedding material region.

In accordance with one advantageous embodiment of the method according to the invention, it is provided as an alternative or in addition that for the external electrical contact-connection of semiconductor circuit regions of the underlying semiconductor circuit arrangement, provision is made of contact elements or bonding wires which are electrically contact-connected to the contacts, which are partly embedded in the embedding material region and which form or have an electrical connection outwardly outside the embedding material region.

In accordance with another advantageous embodiment of the method according to the invention, it is provided as an alternative or in addition that in order to improve the adhesion with the embedding material region, the surface region of the topmost metallization region is subjected to surface treatment.

As an alternative or in addition, it may be provided that in order to improve the adhesion with the embedding material region, the surface region of the contact elements or bonding wires is subjected to surface treatment.

It is conceivable for the topmost metallization region to be formed by sputtering, vapour deposition, electroplating, autogenous electroplating or CVD.

Metals, semimetals, metal alloys, electrically conductive materials generally or compounds or mixtures thereof, e.g., aluminium, copper, aluminium-copper or AlCu, AlCuSi, AlSiCu, tungsten, nickel, nickel-phosphorous or NiP, palladium, gold, molybdenum, silver, zinc, doped polysilicon or mixtures or compounds thereof, may be used as metallization material for the topmost metallization region.

The present invention is explained further using different words below:

The present invention relates in particular to a novel metallization and passivation design for integrated power circuits and power semiconductor components.

Introduction

The construction and the production of highly reliable and robust BEOL stack elements (BEOL: back end of line) for integrated power circuits or power semiconductors is an essential aspect of the present invention. This involves, in particular, ICs with devices which are designed for handling high voltages and/or electric currents. The term BEOL or back end of line relates to operations and process sections and corresponding structures after the formation of devices in the semiconductor substrate.

Technical Background

BEOL stack elements for power ICs typically comprise two metal layers. However, a higher plurality of metal layers are also conceivable. The first of the metal layers is a thin metal layer and forms fine structures. An intermetal dielectric is formed above this first metal layer. The topmost metal layer or metal film—the so-called power metal—makes contact with the first metal layer or metal film through so-called plated-through openings or via openings. The objective of the topmost metallization layer usually consists in conducting and distributing high electric currents that occur during the operation of power devices of the IC, in particular are transmitted and switched by so-called DMOS transistors. Therefore, the topmost metal layer or topmost metallization layer is formed with a higher layer thickness in comparison with other metal or metallization layers.

Furthermore, the contact-connecting pads for electrical analysis or for electrical tests and the wire links are patterned in the topmost metallization layer. This means that typically only the region or the area of the power devices of the IC and the so-called pads or contact pads are coated with the topmost metallization layer, which is also referred to as top metal layer, while the logic portions of the chip remain free from the so-called power metallization.

After the formation of the top metallization that is formed relatively thick, a passivation layer stack is deposited, e.g., comprising a silicon nitride layer and a so-called imide layer, which are deposited and then patterned. The passivation layer stack works with the following objectives:

1) The passivation layer stack protects the devices from impurities, contaminations and moisture.
2) The passivation layer stack buffers the thermomechanical stresses exerted on the chip by the package or the so-called housing.
3) The passivation layer stack ensures good adhesion between the chip material and the embedding material of the housing.

The nitride has to be deposited because, by way of example, the adhesion of the imide to the metal is comparatively poor. On the other hand, the embodying layer adheres comparatively poorly to the metal itself.

This means that a main objective of the imide layer, in particular, consists in supporting adhesion. Independently of this, however, precisely the imide, on account of the high material costs associated therewith, bears a high proportion of costs in chipmaking.

Aspects of the Invention

Embodiments of the method according to the invention and the structure according to the invention differ from conventional methods and from the conventional structure in particular with regard to the design of the topmost metal layer that is made thicker. This means, in particular, that according to the invention the topmost metal layer or the regions or areas covered by the topmost metal layer are formed in extended fashion in comparison with the prior art, so that almost the entire surface of the chip is thereby covered, that is to say in particular also those regions which are not taken up by DMOS devices. This means that as much surface of the chip as is just possible at all is covered by a thick metal layer, namely the power metal layer. In order nevertheless to ensure the required insulation mechanisms and electrically insulating structures between circuit portions which are not permitted to be electrically connected to one another, trench structures are formed which extend from the surface of the topmost metallization layer completely as far as a material layer lying below the topmost metallization layer and have, in particular, a minimum extent, that is to say e.g., of the order of magnitude of the minimum feature size permitted by the patterning methods of the technologies used.

Protecting and sealing the devices on which the circuit arrangement is based with regard to the surroundings is in this case transferred from the protection and passivation layer from the prior art to the topmost metallization layer. The covering of the chip surface thus creates the protection of the underlying devices as in the case of a conventional protection and passivation layer, but without necessitating the use of imide layers or nitride layers.

As has already been mentioned above, the adhesion properties of the embedding material, that is to say e.g., of a moulding composition for forming a package or a housing, with regard to the surface of the metal are rather poor. It is therefore necessary to implement measures to master this problem. Provision is made e.g., for improving the adhesion of the moulding composition or of the package material to the metal of the topmost metallization layer by carrying out surface treatment with regard to the surface of the topmost metallization region, which consists in particular in depositing a dendritic Cr/Zn layer on the metal surface directly prior to embedding with the embedding material. Another method for improving the adhesion properties of the embedding material to the topmost metal consists in applying an organic polymer, also called primer, on the surface of the leadframe, on the surface of the soldered chip and the surface of the bonding wires.

This means that a large metal surface which has been formed in the manner described above not only protects the underlying device but also provides a uniform area or a uniform region made of metal onto which the embedding layer can adhere particularly well after a special treatment in the end fabrication process. This is in contrast to the conventional design of the top metallization and the passivation layer, in which a plurality of surfaces—e.g., made of metal, imide, nitride—and interfaces are present, the method described leading in a suitable manner to a simple and therefore robust and reliable stack of material layers. While the brittleness of the nitride may lead to stress-dictated or pressure-dictated fractures in the passivation layer, the metal layer formed uniformly and with a higher layer thickness is flexible and can therefore take up and absorb deformations of the embedding composition during temperature changes and thus decouples mechanical stresses or pressures which are exerted on the chip by the housing or the embedding layer. This furthermore leads to a higher robustness and reliability of the device. These are the principal advantages of the present invention, added to which there are furthermore cost savings through avoiding nitride layers and imide layers.

ADVANTAGES OF THE INVENTION

The present invention affords, inter alia, the following advantages over conventional power semiconductor components or methods for the production thereof:
1) The chip surface is almost completely covered with a thick metal layer which protects the devices of the semiconductor circuit device on which the power semiconductor component is based from impurities, contaminations and moisture as in the case of an additional and insulating passivation layer from the prior art.
2) Thermomechanical strains and stresses can be absorbed by the thick and almost completely uninterrupted metal layer.
3) By means of special treatment schemes prior to embedding in an embedding material or in a housing material, it is possible to produce better adhesion of the embedding material or of the associated moulding composition to the chip, to be precise compared with a multilayer comprising nitride/imide. In addition, a material that supports or reinforces the adhesion has to be optimized only with regard to one surface material, namely with regard to the metal which forms the basis of the thick metal layer used as the topmost metal layer. This crucially simplifies the requirements made of an adhesion promoter of this type. The patterned area regions are comparatively small and are unimportant for the adhesion.
4) By avoiding specific layers, namely the nitride layer and/or the imide layer, the reliability of the power semiconductor components created is increased since the number of interfaces of successive materials is thereby reduced.
5) The procedure according to the invention avoids and eliminates two lithography layers or lithography steps, thereby reducing the occurrence of defects during the production operation and thus increasing the reliability of the production method and of the power semiconductor components produced.
6) The BEOL layer arrangement or stack arrangement described according to the invention uses neither nitride nor imide and therefore involves lower production costs, compared with conventional layer systems or layer stacks.

Central Aspects of the Present Invention

The present invention is based, inter alia, in particular on laterally extending the topmost metallization layer or metal layer, which is to be provided anyway, in such a way that the underlying semiconductor chip in the sense of a semiconductor material region with a semiconductor circuit arrangement contained there is almost completely covered or capped by a correspondingly thick metal layer of the topmost metallization. Furthermore, in this case, in particular, a special surface treatment is carried out with regard to the leadframe, the soldered chip and the connecting wires directly prior to embedding in a housing material, embedding material or a moulding composition in order to improve in particular the adhesion properties.

Functionally and/or structurally similar or comparable elements and structures are designated by the same reference symbols below, without a detailed description being repeated on every occasion when the respective reference symbols occur.

FIG. 1 is a schematic and sectional side view of a first embodiment of a power semiconductor component 1 according to the invention. The power semiconductor component 1 according to the invention from FIG. 1 is based on a semiconductor material region 20, which may also be referred to as a substrate. There are formed in this substrate 20 a first semiconductor circuit region 31 and a second semiconductor circuit region 32, which together form the semiconductor circuit arrangement 30 on which the power semiconductor component 1 is based. The first semiconductor circuit region 31 may comprise or form e.g. a power semiconductor circuit. The second semiconductor circuit region 32 may comprise or form e.g. a semiconductor logic circuit. However, the invention is not restricted to such a number or arrangement of first and second semiconductor circuit regions 31 and 32.

The semiconductor material region 20 has a surface region 20a. A plurality of contact locations 33 and 34 are provided on the latter for the contact-connection of the semiconductor circuit regions 31, 32 of the semiconductor circuit arrangement 30. Said contact locations 33 and 34 are formed e.g. by a first and lower metallization plane and a first or lower metallization region. The structure comprising semiconductor circuit arrangement with the first and second semiconductor circuit regions 31 and 32 is covered by an insulation region 40, which may also be formed as an intermediate oxide or else is referred to as an intermetal dielectric. For its part, this insulation region 40 has a surface region 40a and, in the region of the first and second contact locations 33 and 34, cutouts 42, which at least partly uncover the first and second contact locations 33 and 34 in order to be filled with a topmost metal material 73, which forms the topmost metallization region 70 and, consequently, first and second contacts 51 and 52 for the first and second contact locations 33 and 34, respectively, and has a surface region 70a. In the region of the first and second contacts 51 and 52, contact elements 55 in the form of so-called bonding wires are fitted to the surface region 70a of the metal material 73 of the topmost metallization region 70. By means of these bonding wires 55, the semiconductor circuit arrangement 30 on which the power semiconductor component 1 is based is contact-connected externally via the first and second contacts 51 and 52. For the purpose of protection and for the purpose of electrical insulation, the structure thus obtained is embedded in an embedding material 90. The embedding material 90 has a surface region 90a and may also be referred to as a moulding composition or as a housing for the power semiconductor component 1 or as part thereof. For the purpose of electrically insulating structures of the semiconductor circuit arrangement 30 on which the power semiconductor component 1 is based, which structures are to be electrically insulated from one another, cutouts or trench structures 72 are provided in the metal material 73 of the topmost metallization region 70, which cutouts or trench structures reach from the surface region 70a continuously as far as a surface region 40a of a material lying below the topmost metallization region 70, this material region lying directly below the topmost metallization region 70 being formed by the intermetal dielectric 40. The trench structure 72 is filled by the embedding material 90. In this way, almost the entire structure below the topmost metallization region 70, with regard to its lateral extent, is almost completely covered with the metal material 73 of the topmost metallization region 70, so that the topmost metallization region 70 simultaneously fulfils the function of a protection and sealing layer or of a protection and sealing region 60.

Figure 2:
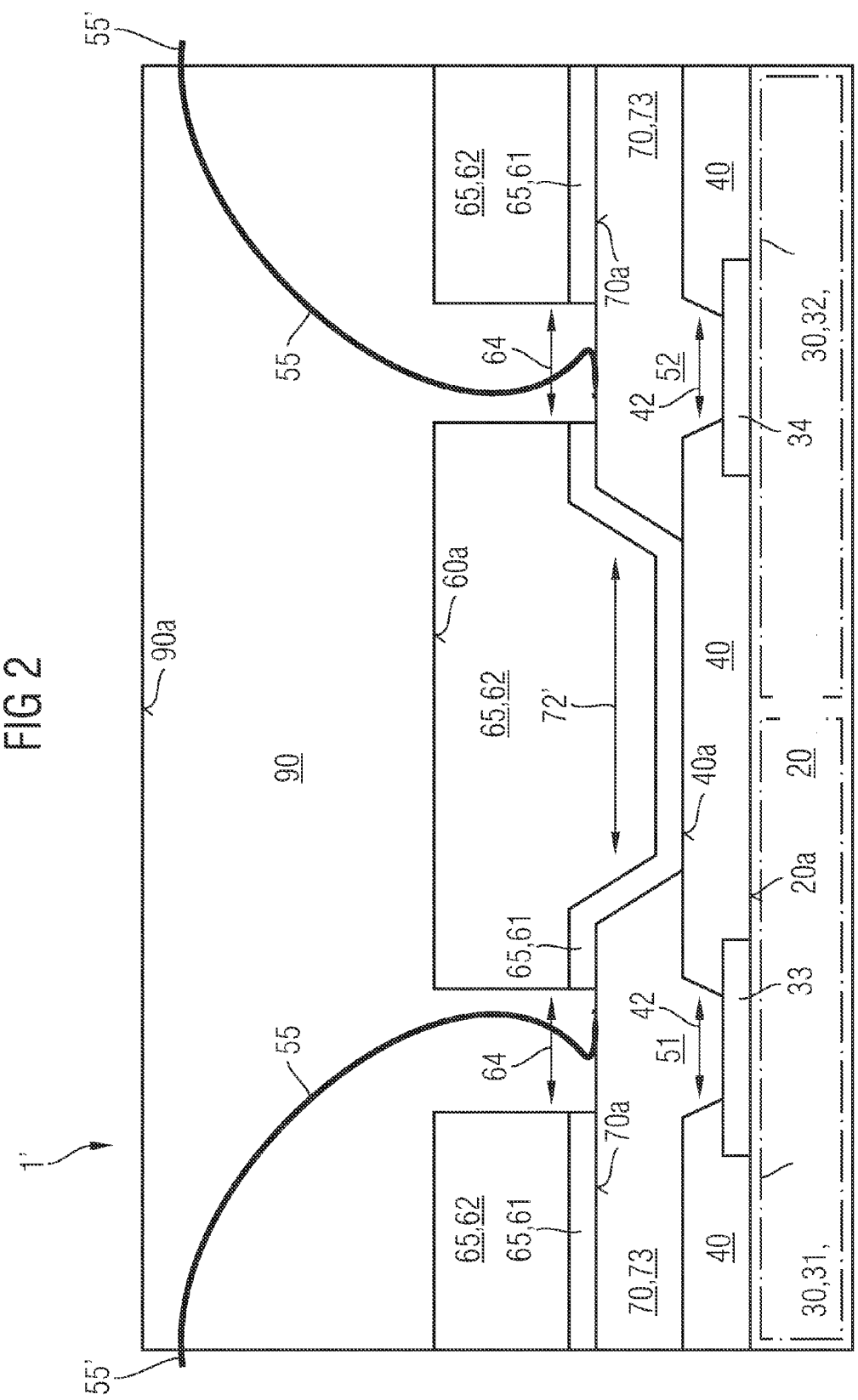
FIG. 2 is a schematic and sectional side view of a power semiconductor component from the prior art.

In contrast thereto, in the case of a power semiconductor component 1' from the prior art in accordance with FIG. 2, it is necessary, for the protection and for the sealing of deeper material structures of the conventional power semiconductor component 1', to form a protection and sealing layer stack 61, 62, the latter also having to be patterned in order to realize cutouts 64 for the connection of the bonding wires 55 onto the surface region 70a of the topmost metallization region 70 in the region of the first and second contacts 51 and 52. At the same time it is also evident from FIG. 2 that there is no almost complete covering of the structure of the conventional power semiconductor component 1' that lies below the topmost metallization region 70, since the uncovered regions 72' of this structure, which are not covered by any metal material 73 of the topmost metallization region 70, take up a very much larger extent.

In contrast to the procedure according to the invention, therefore, in the case of the embodiment of FIG. 2, it is necessary to form a plurality of additional layers 61 and 62 in the sense of a protection and passivation layer stack 65, so that in the production of a conventional power semiconductor component, additional and expensive material has to be used and patterned in an additional method step. The bottommost layer 61 of the protection and passivation layer stack 65 may comprise a nitride, for example, and the topmost layer 62 of the protection and passivation layer stack 65 may comprise an imide.

Figure 3:
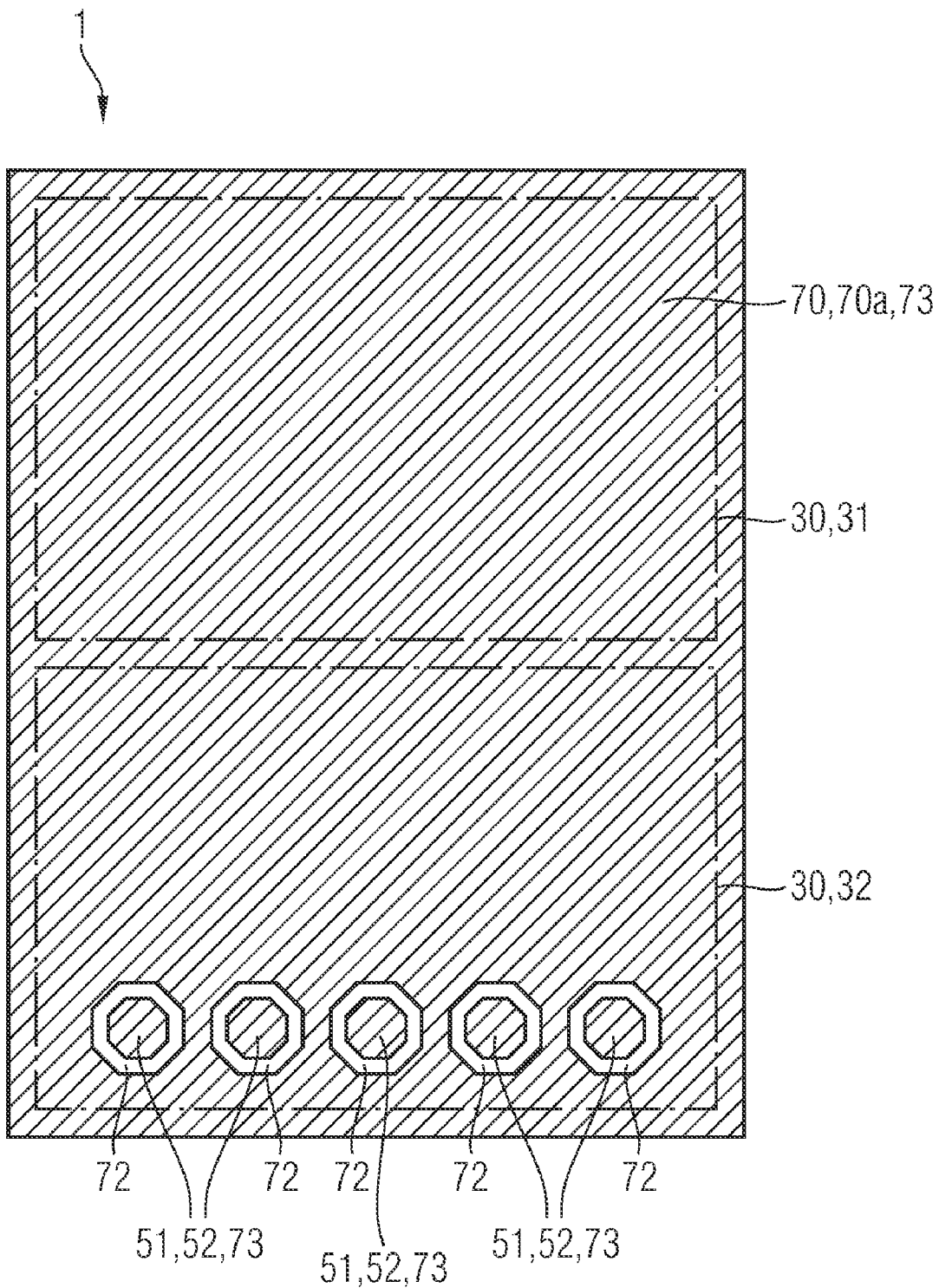
FIG. 3 is a schematic plan view of another embodiment of the power semiconductor component according to the invention, in which case, however, the material layers following the topmost metallization layer have been omitted.

FIG. 3 illustrates a plan view of a power semiconductor component 1 according to the invention, which may be constructed in a similar manner to the power semiconductor component 1 according to the invention as illustrated in FIG. 1, but the material layers arranged above the topmost metallization region 70 and also the bonding wires 55 from FIG. 1 have been omitted. It is evident that almost the entire area of the structure lying below the topmost metallization region 70 is covered with metal material 73 of the topmost metallization region 70, so that the entire surface of the power semiconductor component 1 from FIG. 3 with the first semiconductor circuit region 31 and the second semiconductor circuit region 32 of the underlying semiconductor circuit arrangement 30 is formed with the surface region 70a of the topmost metallization region 70. In the case of the second semiconductor circuit region 32, corresponding first and second contacts 51 and 52 are also shown in the lower region of FIG. 3, which contacts are electrically insulated from the rest of the topmost metallization region 70 by corresponding provided trench structures 72 or cutouts 72.

Figure 4:
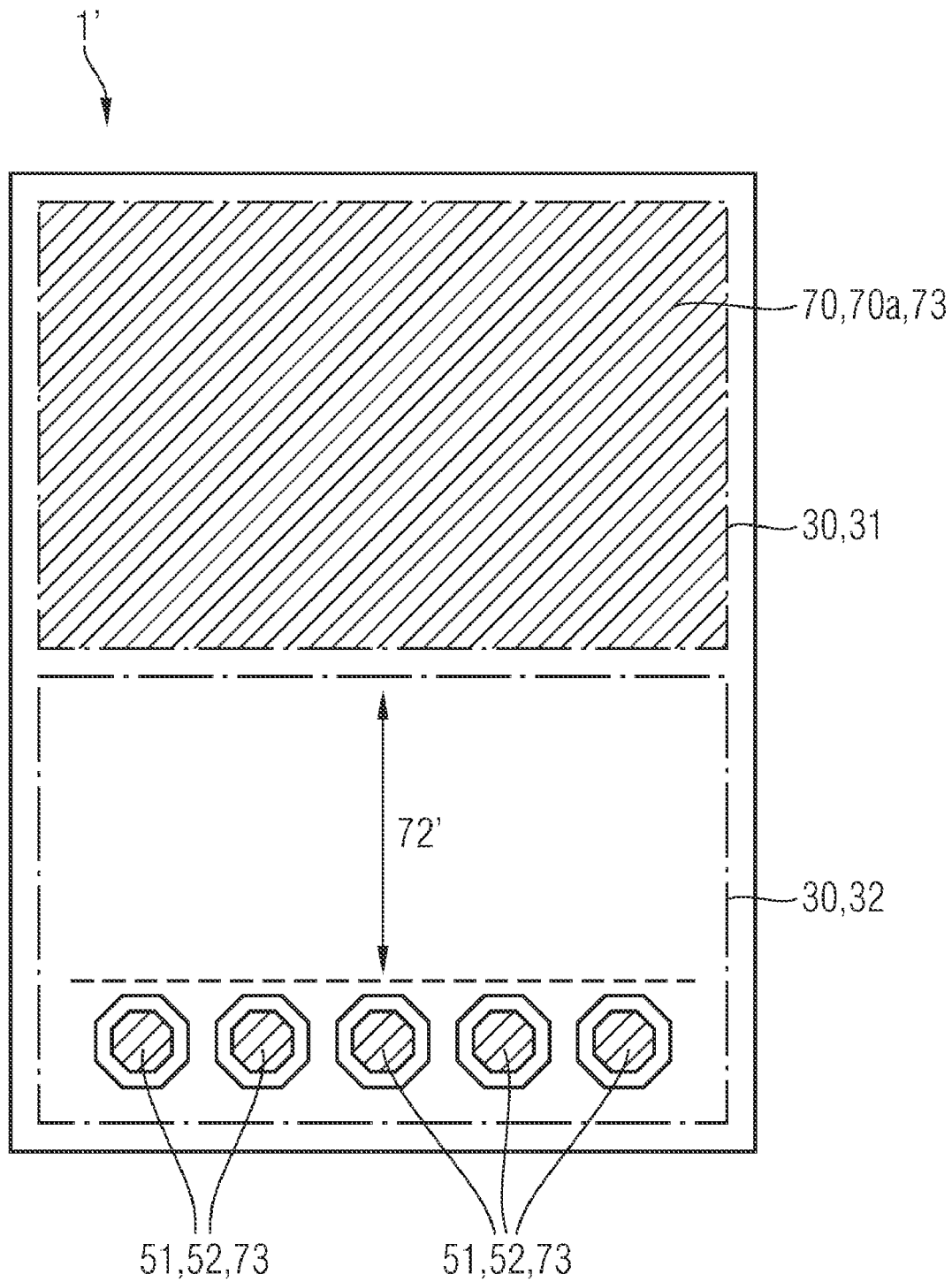
FIG. 4 illustrates a schematic plan view of another power semiconductor component from the prior art.

In contrast thereto, the conventional embodiment of a power semiconductor component 1' from FIG. 4 likewise shows in schematic plan view that exclusively the first semiconductor circuit region 31 has the metal material 73 of the topmost metallization region 70 and otherwise corresponding regions of the metal material 73 are provided only in the region of the first and second contacts 51 and 52, namely directly above the first and second contact locations 33 and 34. Otherwise, no covering with the topmost metallization region 70 and the corresponding metal material 73 is provided in the region of the second semiconductor circuit arrangement 32, thereby resulting in cutouts or left-free portions 72' formed in comparatively spacious fashion laterally.

The contacts 51 and 52 illustrated in the figures may have any desired base area; they are not fixed to the octagonal form shown in the figures.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An integrated power semiconductor component comprising:
    a semiconductor material region or a basic semiconductor structure with a surface region;
    at least one semiconductor circuit region provided in the semiconductor material region or in the basic semiconductor structure,
    in which, for a contact-connection of the semiconductor circuit region, in the surface region of the semiconductor material region or of the basic semiconductor structure and electrically connected thereto via contact locations therein, contacts are provided with or from a portion of a topmost metallization layer; and
    an embedding material layer for embedding the semiconductor material region or the basic semiconductor structure with the contact locations and the contacts, in which, below the embedding material layer, a protection and sealing material region is provided laterally beyond the contact locations and the contacts;
    wherein the topmost metallization layer being formed in a manner extended laterally also beyond the contact locations and the contacts in such a way,
    wherein the topmost metallization layer laterally almost completely extends over and covers the directly underlying structures of the integrated power semiconductor component,
    wherein the protection and sealing material region is formed directly by the topmost metallization layer whilst avoiding customary and additional electrically insulating protection and sealing stack layers,
    wherein the embedding material layer and the topmost metallization layer are formed above the surface region of the semiconductor material region or the basic semiconductor structure,
    wherein the topmost metallization layer is formed adjacent to the embedding material layer, and
    wherein on the power semiconductor component the topmost metallization layer is formed by sputtering, vapour deposition, electroplating, autogenous electroplating or CVD.

2. The component of claim 1, wherein the topmost metallization layer overall and the contacts and the protection and sealing material region are formed integrally with one another as a continuous material layer.

3. The component of claim 1, wherein for the contact-connection of semiconductor circuit regions of the underlying semiconductor circuit arrangement, provision is made of contact elements or bonding wires which are electrically contact-connected to the contacts, which are partly embedded in the embedding material layer and which form or have an electrical connection outwardly outside the embedding material layer.

4. A component of claim 1, wherein in order to improve the adhesion with the embedding material layer, the surface region of the topmost metallization layer is subjected to surface treatment.

5. The component of claim 1, wherein in order to improve adhesion with the embedding material layer, the surface region of the contacts or bonding wires is subjected to surface treatment.

6. The component of claim 1, wherein metals, semimetals, metal alloys, electrically conductive materials generally or compounds or mixtures thereof, in particular aluminium, copper, aluminium-copper or AlCu, AlCuSi, AlSiCu, tungsten, nickel, nickel-phosphorous or NiP, palladium, gold, molybdenum, silver, zinc, doped polysilicon or mixtures or compounds thereof are provided as metallization material for the topmost metallization layer.

7. An integrated power semiconductor component comprising:
- a semiconductor material region or a basic semiconductor structure with a surface region;
- at least one semiconductor circuit region is provided in the semiconductor material region or in the basic semiconductor structure,
- in which, for a contact-connection of the semiconductor circuit region, in the surface region of the semiconductor material region or of the basic semiconductor structure and electrically connected thereto via contact locations therein, contacts are provided with or from a portion of a topmost metallization layer; and
- an embedding material layer for embedding the semiconductor material region or the basic semiconductor structure with the contact locations and the contacts,
- in which, below the embedding material layer, a protection and sealing material region is provided laterally beyond the contact locations and the contacts;
- wherein the topmost metallization layer being formed in a manner extended laterally beyond the contact locations and the contacts in such a way,
- wherein the topmost metallization layer laterally almost completely extends over and covers the directly underlying structures of the integrated power semiconductor component,
- wherein the protection and sealing material region is formed directly by the topmost metallization layer whilst avoiding customary and additional electrically insulating protection and sealing stack layers,
- wherein for the electrical insulation of regions or contacts that are to be electrically insulated from one another, electrically insulating trench structures are formed which extend from the surface region of the topmost metallization region continuously as far as the surface region of a material region respectively lying directly below the topmost metallization region,
- wherein each trench structure is filled with an electrically insulating material,
- wherein the embedding material layer and the topmost metallization layer are located above the surface region of the semiconductor material region or the basic semiconductor structure,
- wherein the topmost metallization layer is located below the embedding material layer, and
- wherein on the power semiconductor component the topmost metallization layer is formed by sputtering, vapour deposition, electroplating, autogenous electroplating or CVD.

8. The component of claim 7, wherein each trench structure is filled with the material of the embedding material layer.

* * * * *